(12) United States Patent
Rofougaran et al.

(10) Patent No.: US 7,825,871 B2
(45) Date of Patent: Nov. 2, 2010

(54) METHOD AND SYSTEM FOR EQUALIZING ANTENNA CIRCUIT MATCHING VARIATIONS

(75) Inventors: Ahmadreza Rofougaran, Newport Coast, CA (US); Maryam Rofougaran, Rancho Palos Verde, CA (US)

(73) Assignee: Broadcom Corporation

( * ) Notice: Subject to any disclaimer, the term of this patent is extended or adjusted under 35 U.S.C. 154(b) by 453 days.

(21) Appl. No.: 11/750,095

(22) Filed: May 17, 2007

(65) Prior Publication Data

US 2008/0231543 A1 Sep. 25, 2008

Related U.S. Application Data

(60) Provisional application No. 60/895,698, filed on Mar. 19, 2007.

(51) Int. Cl.
*H01Q 1/50* (2006.01)
(52) U.S. Cl. .......................... 343/850; 343/722
(58) Field of Classification Search .................. 343/722, 343/723, 850, 852
See application file for complete search history.

(56) References Cited

U.S. PATENT DOCUMENTS

| | | | | |
|---|---|---|---|---|
| 2,696,611 A | * | 12/1954 | Halstead | 370/312 |
| 2,697,745 A | * | 12/1954 | Halstead | 358/425 |
| 5,548,829 A | * | 8/1996 | Suzuki et al. | 455/180.3 |
| 5,793,328 A | * | 8/1998 | Ward et al. | 342/357.09 |
| 6,182,011 B1 | * | 1/2001 | Ward | 701/213 |
| 6,870,441 B2 | * | 3/2005 | Veyres et al. | 333/133 |
| 6,924,761 B2 | * | 8/2005 | Jiang et al. | 341/154 |
| 2005/0186927 A1 | * | 8/2005 | Hayashi et al. | 455/232.1 |
| 2008/0317165 A1 | * | 12/2008 | Bagheri et al. | 375/296 |

* cited by examiner

*Primary Examiner*—Tho G Phan
(74) *Attorney, Agent, or Firm*—McAndrews, Held & Malloy, Ltd.

(57) ABSTRACT

Aspects of a method and system for equalizing antenna circuit matching variations may include adjusting a frequency response of an antenna via a programmable filter and a gain of the antenna by varying a programmable amplifier. The antenna frequency response and the antenna gain may be adjusted dynamically and/or autonomously. The programmable amplifier and the programmable filter may be adjusted sequentially or simultaneously. The programmable filter may be an LC-type circuit and the programmable amplifier may be a low-noise amplifier. In an exemplary embodiment of the invention, the programmable filter may comprise a programmable capacitance in a matrix arrangement and/or a programmable inductance in a matrix arrangement.

22 Claims, 5 Drawing Sheets

METHOD AND SYSTEM FOR EQUALIZING ANTENNA CIRCUIT MATCHING VARIATIONS

CROSS-REFERENCE TO RELATED APPLICATIONS/INCORPORATION BY REFERENCE

This application makes reference to, claims priority to, and claims the benefit of U.S. Provisional Application Ser. No. 60/895,698, filed on Mar. 19, 2007.

The above referenced application is hereby incorporated herein by reference in its entirety.

FIELD OF THE INVENTION

Certain embodiments of the invention relate to signal processing for communication systems. More specifically, certain embodiments of the invention relate to a method and system for equalizing antenna circuit matching variations.

BACKGROUND OF THE INVENTION

Communication receiver systems that rely on receiving radio frequency signals are dependent on certain characteristics of the antenna used, in order to ensure correct operation. One such parameter, for example, may be the antenna impedance. If the impedance between the receiver and the antenna is not matched, the feed line may generate reflections at such unmatched impedance interfaces, reflecting the received signal back towards the source. This may generate so-called standing waves and reduces the effective power transfer from the antenna to the receiving device.

Another factor that may impact the operation of a receiver may be variations due to manufacturing. In particular for small antennas and/or antennas that may be operated in physically constrained spaces, small changes in the operating environment may impact the antenna characteristics. For example, small antennas on Printed Circuit Boards (PCBs) may exhibit relatively large sample variation. In addition, due to the close proximity of a PCB antenna with other circuitry, there may be some electromagnetic coupling that may affect the antenna performance. Furthermore, antennas from different manufacturers may also differ in their characteristics.

Antennas generally respond differently at different frequencies. For example, the antenna gain may be frequency dependent. Also, changes in the operating environment, for example temperature, may affect the circuit-antenna matching.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for equalizing antenna circuit matching variations, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for equalizing antenna circuit matching variations. Aspects of the method and system for equalizing antenna circuit matching variations may comprise adjusting a frequency response of an antenna via a programmable filter and a gain of the antenna by varying a programmable amplifier. The antenna frequency response and the antenna gain may be adjusted dynamically and/or autonomously. The programmable amplifier and the programmable filter may be adjusted sequentially or simultaneously. The programmable filter may be an LC-type circuit and the programmable amplifier may be a low-noise amplifier. In an exemplary embodiment of the invention, the programmable filter may comprise a programmable capacitance in a matrix arrangement and/or a programmable inductance in a matrix arrangement.

Figure 1:
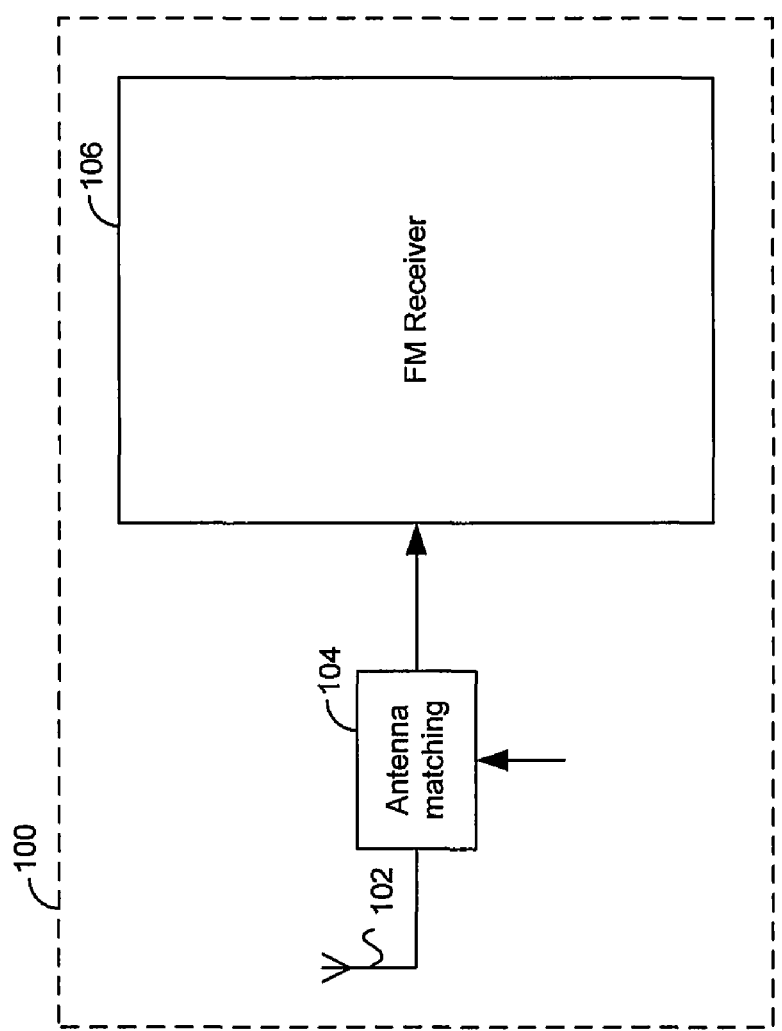
FIG. 1 is a block diagram illustrating an exemplary FM receiver system, in accordance with an embodiment of the invention.

FIG. 1 is a block diagram illustrating an exemplary FM receiver system, in accordance with an embodiment of the invention. Referring to FIG. 1, there is shown an FM receiver system 100 comprising an antenna 102, an antenna matching block 104, and a FM receiver 106. The antenna matching block 104 may comprise suitable logic, circuitry and/or code to enable matching the antenna 102 to an FM receiver 106. The FM receiver 106 may comprise suitable logic, circuitry and/or code to enable processing of the radio frequency signals received via the antenna 102.

In an exemplary FM receiver system as illustrated in FIG. 1, it may be desirable that the input signal to the FM receiver 106 may comprise certain well-defined characteristics. Due to a large number of factors, the antenna 102 characteristics may be variable. For example, the operating environment and manufacturing tolerances may affect the antenna characteristics. In these instances, it may be desirable to adjust the antenna 102 characteristics in the antenna matching block 104 that may achieve well-defined input signals for the FM receiver 106.

Figure 2:
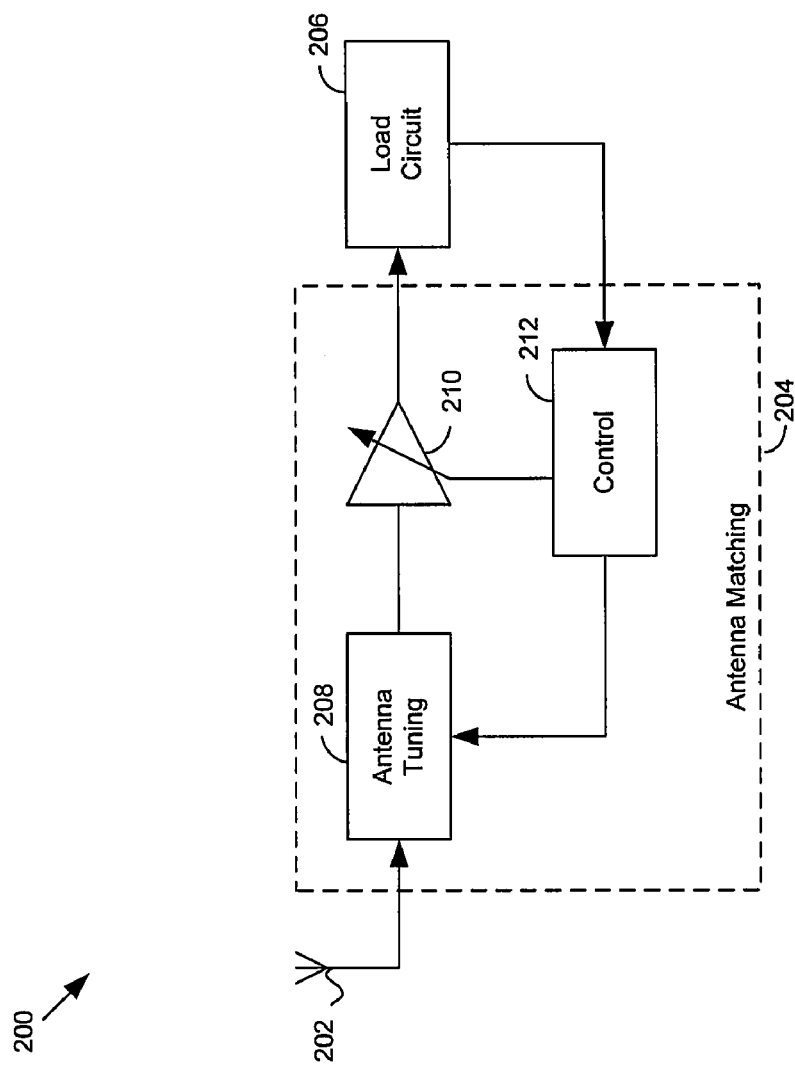
FIG. 2 is a block diagram illustrating an exemplary embodiment of an antenna matching system, in accordance with an embodiment of the invention.

FIG. 2 is a block diagram illustrating an exemplary embodiment of an antenna matching system, in accordance with an embodiment of the invention. Referring to FIG. 2, there is shown an antenna matching system 200, comprising an antenna 202, an antenna matching block 204 and a load circuit 206. The antenna matching block 204 may comprise an antenna tuning block 208, an amplifier 210 and a control block 212.

The antenna tuning block 208 may comprise suitable logic, circuitry and/or code to enable tuning of the antenna 202. The amplifier 210 may comprise suitable logic, circuitry and/or code to enable amplification of the signal fed to amplifier 210 from the antenna tuning block 208. The gain of amplifier 210 may be controlled by the control block 212, which may comprise suitable logic, circuitry and/or code to enable control of the antenna tuning block 208 and/or the amplifier 210.

The antenna 202 may be subject to considerable sample variation. Differences between antennas may be due to differences between manufacturers and/or tolerances in the manufacturing process. Particularly very small antennas, for example on printed circuit boards (PCBs), may exhibit large variations between different samples. Furthermore, antenna installation and/or arrangement on a printed circuit board may affect the antenna characteristics, as may environmental factors. Moreover, the antenna gain may typically be frequency dependent. For at least the reasons given above, it may be desirable to tune the antenna characteristics.

The antenna tuning block 208 may be, for example, a programmable filter. This may permit adjustment of, for example, a frequency response of the antenna and its resonant frequency. Primarily, the antenna tuning block 208 may be enabled to adjust the frequency response of the antenna 202. The amplifier 210 may be used to compensate for variability in antenna gain. The load circuit 206 may be a system requiring an antenna input signal.

The antenna matching 204 may be controlled by one or more of a plurality of performance metrics. For example, if the load circuit 206 may be a communications receiver, the control block 212 may adjust the gain of amplifier 210 and the antenna tuning block 208 as a function of the sensitivity. Other exemplary metrics that may be used may comprise Signal-to-Interference-and-Noise ratio (SINR), Bit Error Rate (BER) and/or Packet Error Rate (PER). In some instances, it may also be desirable to increase blocking of certain frequencies, for example, due to interference. The control block 212 may also be controlled manually. In some embodiments of the invention, the control block 212 may autonomously and dynamically adjust the antenna 202 characteristics. In other embodiments of the invention, the antenna tuning block 208 and the amplifier 210 may be calibrated and not be adjusted dynamically.

Figure 3A:
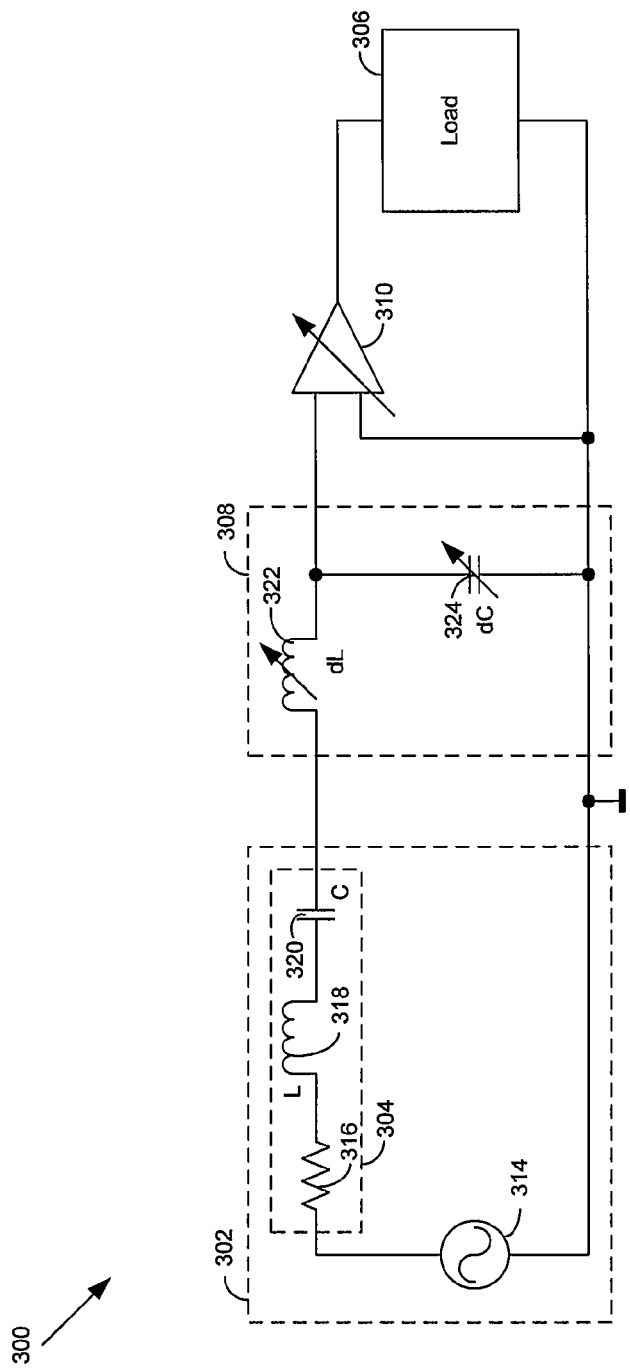
FIG. 3A is a circuit diagram illustrating an exemplary embodiment of an antenna matching system, in accordance with an embodiment of the invention.

FIG. 3A is a circuit diagram illustrating an exemplary embodiment of an antenna matching system, in accordance with an embodiment of the invention. Referring to FIG. 3A, there is shown an antenna matching system 300 comprising an antenna equivalent circuit 302, an antenna tuning block 308, an amplifier 310 and a load 306. The antenna equivalent circuit 302 may be a Thevenin equivalent circuit of an antenna and may be used to approximately model the behavior of a receive antenna substantially similar to antenna 202. The antenna equivalent circuit 302 may comprise a voltage source 314 and an antenna impedance 304. The antenna impedance may comprise a resistor 316, an inductor L 318 and a capacitor C 320. The antenna tuning block 308 may comprise a variable inductor dL 322 and a variable capacitor dC 324. The amplifier 310 may be substantially similar to amplifier 210.

The antenna equivalent circuit 302 may comprise voltage source 314 that may represent the received signal at antenna 202, and the antenna impedance 304. The frequency characteristics of the antenna equivalent circuit 302 may be determined primarily by the capacitance C 320 and the inductor L 318. The resonant frequency of the antenna may be defined approximately by (antenna under purely resistive load) the following relationship:

$$f0 \approx \frac{1}{2\pi\sqrt{LC}}$$

The antenna tuning block 308 may adjust the frequency response and the resonant frequency of the antenna by adjusting the total inductance and capacitance through inductor dL 322 and capacitor dC 324. The resonant frequency may be approximately given by the following relationship:

$$f0 \approx \frac{1}{2\pi\sqrt{L_{cor}C_{cor}}}$$
$$L_{cor} \approx L + dL$$
$$C_{cor} \approx \left(\frac{1}{C} + \frac{1}{dC}\right)^{-1}$$

The capacitor dC 324 and the inductor dL 322 may be programmable and may be controlled by a control block substantially similar to the control block 212. Similarly, the amplifier 310 may be controlled by a control block. The amplifier 310 may adjust the gain available to the load 306.

Figure 3B:
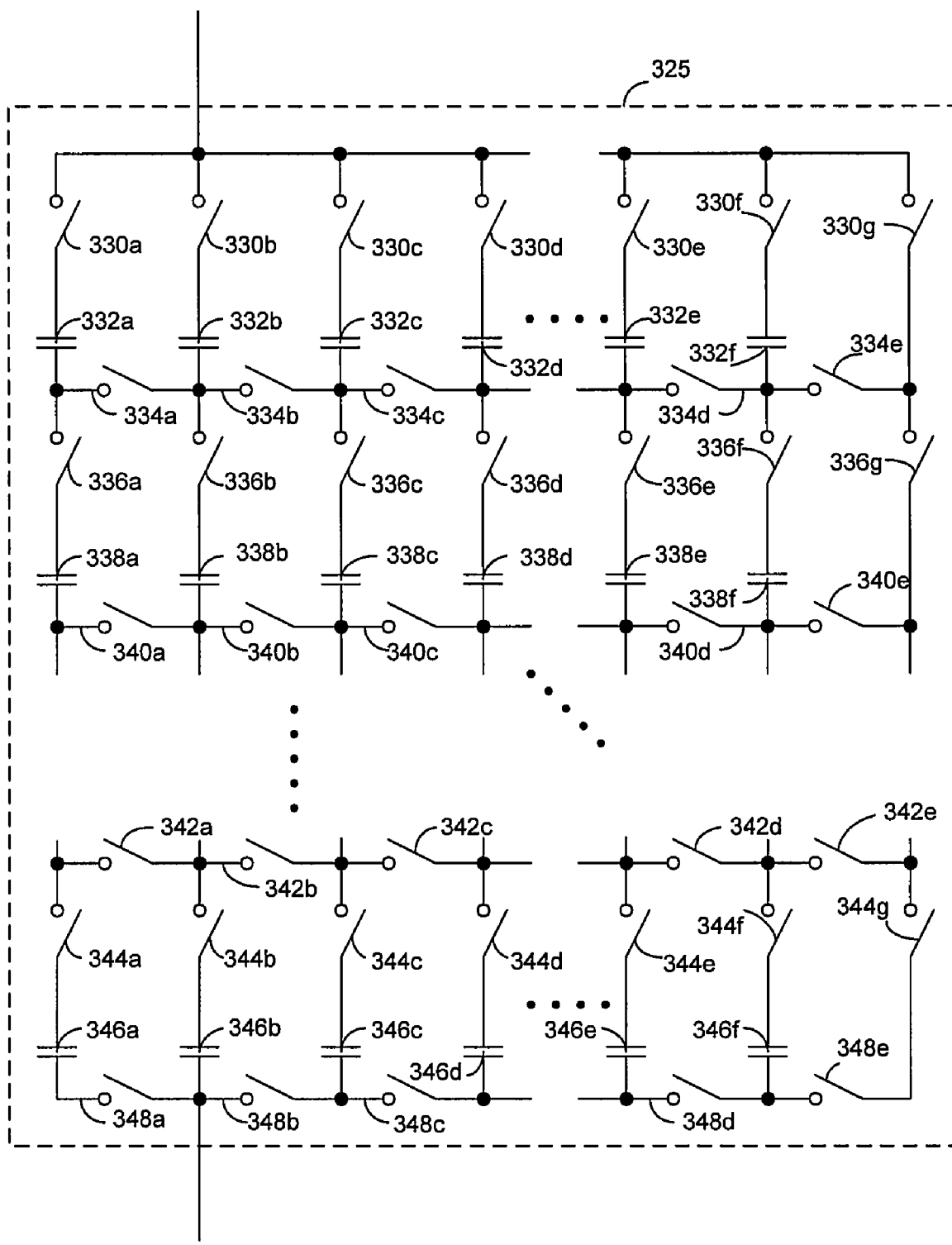
FIG. 3B is a circuit diagram illustrating an exemplary programmable capacitance, in accordance with an embodiment of the invention.

FIG. 3B is a circuit diagram illustrating an exemplary programmable capacitance, in accordance with an embodiment of the invention. Referring to FIG. 3B, there is shown a programmable capacitance 325 comprising switches 330a-g, 334a-e, 336a-g, 340a-e, 342a-e, 344a-g and 348a-e, and capacitors 332a-f, 338a-f, 346a-f.

In one embodiment of the invention, a programmable capacitor may be implemented in a switchable matrix, as illustrated in FIG. 3B. The matrix may be of size M×N capacitors, where M and N may be positive integers. Depending on how the switches 330a-g, 334a-e, 336a-g, 340a-e, 342a-e, 344a-g and 348a-e may be set, a large number of values for the programmable capacitance 325 may be set by switching capacitances in series and in parallel, as desired.

A programmable inductance may be implemented in a matrix fashion in a substantially similar manner to the programmable capacitance illustrated in FIG. 3B.

Figure 4:
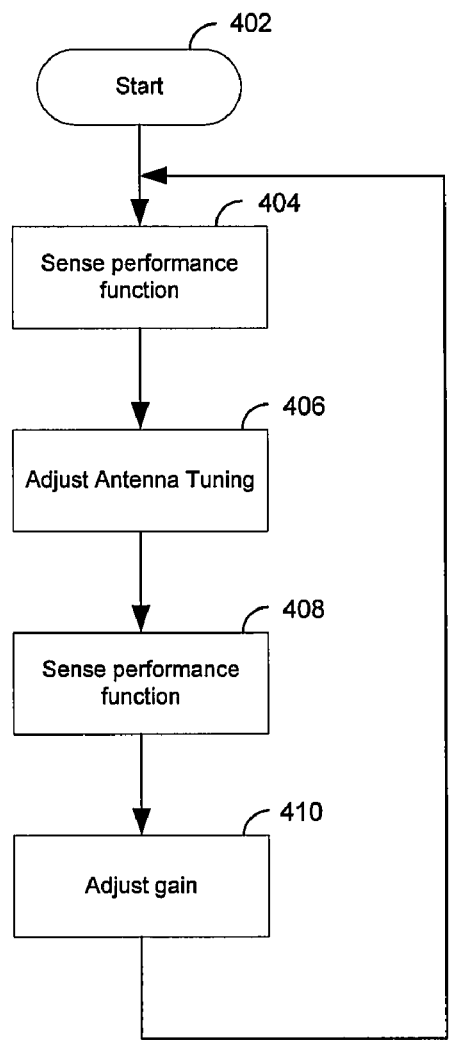
FIG. 4 is a flow chart illustrating an exemplary sequential antenna matching algorithm, in accordance with an embodiment of the invention.

FIG. 4 is a flow chart illustrating an exemplary sequential antenna matching algorithm, in accordance with an embodiment of the invention. The sequential antenna matching algorithm may be initialized in step 402. In step 404, the performance function may be sensed. As described for FIG. 2, the performance function may be SNR, BER and/or any other function that may permit the parameters of, for example, the antenna tuning block 208 and/or the control block 212 to be adjusted suitably. According to the exemplary embodiment of the invention depicted in FIG. 4, the gain in amplifier 210 and the antenna tuning in antenna tuning block 208 may be performed in a sequential manner. Accordingly, in step 406, the antenna tuning block 208 may be adjusted, for example via the control block 212. In step 408, the performance function may be sensed, in response to changes to the antenna tuning block 208. The gain of the amplifier 210 may be adjusted in step 410 for example via the control block 212. The algorithm may recommence in step 404. In another embodiment of the invention, adjusting the antenna tuning block 208 and the amplifier 210 may be performed in parallel, instead of sequentially.

In accordance with an embodiment of the invention, a method and system for equalizing antenna circuit matching variations may comprise adjusting a frequency response of an antenna 202 via a programmable filter, for example antenna tuning block 208, and adjusting a gain of the antenna 202 by varying, for example, a gain of a programmable amplifier 210. The antenna frequency response and the antenna gain may be adjusted dynamically and/or autonomously, as described for FIG. 2. The programmable amplifier 210 and the programmable filter 208 may be adjusted sequentially or simultaneously. The programmable filter 208 may be an LC-type circuit and the programmable amplifier 210 may be a low-noise amplifier. In an exemplary embodiment of the invention, the programmable filter 208 may comprise a programmable capacitance in a matrix arrangement and/or a programmable inductance in a matrix arrangement, as illustrated in FIG. 3B.

Another embodiment of the invention may provide a machine-readable storage, having stored thereon, a computer program having at least one code section executable by a machine, thereby causing the machine to perform the steps as described above for equalizing antenna circuit matching variations.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
adjusting a frequency response of an antenna via a programmable filter, to generate a frequency response adjusted signal; and
adjusting a gain of said antenna by varying a gain of a programmable amplifier that amplifies said frequency response adjusted signal, wherein said frequency response adjusting takes place prior to said gain adjusting.

2. The method according to claim 1, comprising adjusting said frequency response dynamically.

3. The method according to claim 1, comprising adjusting said programmable filter autonomously.

4. The method according to claim 1, comprising adjusting said gain of said antenna dynamically.

5. The method according to claim 1, comprising varying said gain of said programmable amplifier autonomously.

6. The method according to claim 1, comprising adjusting said programmable filter and said programmable amplifier sequentially.

7. The method according to claim 1, comprising adjusting said programmable filter and said programmable amplifier simultaneously.

8. The method according to claim 1, wherein said programmable amplifier is a low-noise amplifier.

9. A system for processing communication signals, the system comprising:
one or more circuits, said one or more circuits enable:
adjustment of a frequency response of an antenna via a programmable filter, to generate a frequency response adjusted signal; and
adjustment of a gain of said antenna by varying a gain of a programmable amplifier that amplifies said frequency response adjusted signal, wherein said frequency response adjusting takes place prior to said gain adjusting.

10. The system according to claim 9, wherein said one or more circuits enable adjustment of said antenna frequency response dynamically.

11. The system according to claim 9, wherein said one or more circuits enable adjustment of said programmable filter autonomously.

12. The system according to claim 9, wherein said one or more circuits enable adjustment of said gain of said antenna dynamically.

13. The system according to claim 9, wherein said one or more circuits enable varying of said gain of said programmable amplifier autonomously.

14. The system according to claim 9, wherein said one or more circuits enable adjustment of said programmable filter and said programmable amplifier sequentially.

15. The system according to claim 9, wherein said one or more circuits enable adjustment of said programmable filter and said programmable amplifier simultaneously.

16. The system according to claim 9, wherein said programmable amplifier is a low-noise amplifier.

17. A method for processing communication signals, the method comprising:
adjusting a frequency response of an antenna via a programmable filter, to generate a frequency response adjusted signal; and
adjusting a gain of said antenna by varying a gain of a programmable amplifier that amplifies said frequency response adjusted signal, wherein said frequency response adjusting takes place prior to said gain adjusting, and wherein said programmable filter is an LC-type circuit.

18. A method for processing communication signals, the method comprising:
adjusting a frequency response of an antenna via a programmable filter, to generate a frequency response adjusted signal; and
adjusting a gain of said antenna by varying a gain of a programmable amplifier that amplifies said frequency response adjusted signal, wherein said frequency response adjusting takes place prior to said gain adjusting, and wherein said programmable filter comprises a programmable capacitance in a matrix arrangement.

19. A method for processing communication signals, the method comprising:
adjusting a frequency response of an antenna via a programmable filter, to generate a frequency response adjusted signal; and
adjusting a gain of said antenna by varying a gain of a programmable amplifier that amplifies said frequency response adjusted signal, wherein said frequency response adjusting takes place prior to said gain adjusting, and wherein said programmable filter comprises a programmable inductance in a matrix arrangement.

20. A system for processing communication signals, the system comprising:
one or more circuits, said one or more circuits enable:
adjustment of a frequency response of an antenna via a programmable filter, to generate a frequency response adjusted signal; and
adjustment of a gain of said antenna by varying a gain of a programmable amplifier that amplifies said frequency response adjusted signal, wherein said frequency response adjusting takes place prior to said gain adjusting, and wherein said programmable filter is an LC-type circuit.

21. A system for processing communication signals, the system comprising:
one or more circuits, said one or more circuits enable:
adjustment of a frequency response of an antenna via a programmable filter, to generate a frequency response adjusted signal; and
adjustment of a gain of said antenna by varying a gain of a programmable amplifier that amplifies said frequency response adjusted signal, wherein said frequency response adjusting takes place prior to said gain adjusting, and wherein said programmable filter comprises a programmable capacitance in a matrix arrangement.

22. A system for processing communication signals, the system comprising:
one or more circuits, said one or more circuits enable:
adjustment of a frequency response of an antenna via a programmable filter, to generate a frequency response adjusted signal; and
adjustment of a gain of said antenna by varying a gain of a programmable amplifier that amplifies said frequency response adjusted signal, wherein said frequency response adjusting takes place prior to said gain adjusting, and wherein said programmable filter comprises a programmable inductance in a matrix arrangement.

* * * * *